United States Patent
Xu et al.

[11] Patent Number: 5,949,187
[45] Date of Patent: Sep. 7, 1999

[54] ORGANIC ELECTROLUMINESCENT DEVICE WITH PLURAL MICROCAVITIES

[75] Inventors: Ji-Hai Xu; Rong-Ting Huang, both of Gilbert; Franky So, Tempe, all of Ariz.

[73] Assignee: Motorola, Inc., Schaumburg, Ill.

[21] Appl. No.: 08/902,387

[22] Filed: Jul. 29, 1997

[51] Int. Cl.$^6$ ........................................................ H01J 1/62
[52] U.S. Cl. .......................... 313/504; 313/506; 313/509; 313/498; 313/110; 313/111; 313/112
[58] Field of Search .................... 313/504, 506, 313/509, 498, 110, 111, 112

[56] References Cited

U.S. PATENT DOCUMENTS 5,405,710   4/1995   Dodabalapur et al. ................. 313/506
5,478,658  12/1995   Dodabalapur et al. ................. 313/506

FOREIGN PATENT DOCUMENTS

683623A1   5/1995   European Pat. Off. .

Primary Examiner—Sandra O'Shea
Assistant Examiner—Ronald E. DelGizzi
Attorney, Agent, or Firm—Eugene A. Parsons; William E. Koch

[57] ABSTRACT

An OED with a first microcavity including a first transparent spacer positioned adjacent the diode light output and a first mirror stack positioned on the first spacer to reflect light back into the OED and to define an optical length of the first microcavity. The optical length of the first microcavity being such that light emitted from the first microcavity has a first spectrum. A second microcavity including a second transparent spacer positioned adjacent the first microcavity and a second mirror stack positioned on the second spacer to reflect light toward the first microcavity and to define an optical length of the second microcavity. The optical length of the second microcavity being such that light emitted from the second microcavity has a second spectrum. Additional microcavities can be placed in the structure to further enhance and alter the light spectrum.

30 Claims, 3 Drawing Sheets

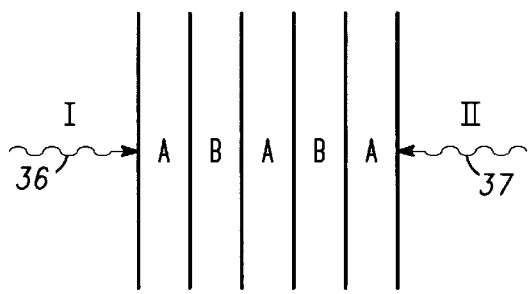
FIG. 3
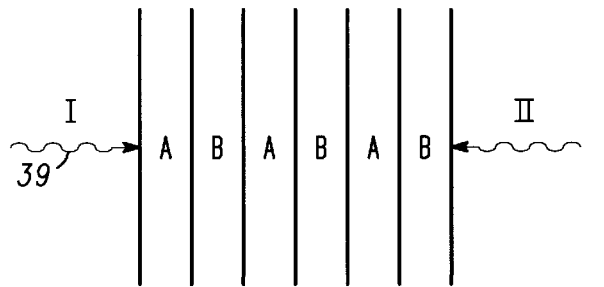
FIG. 4
FIG. 5
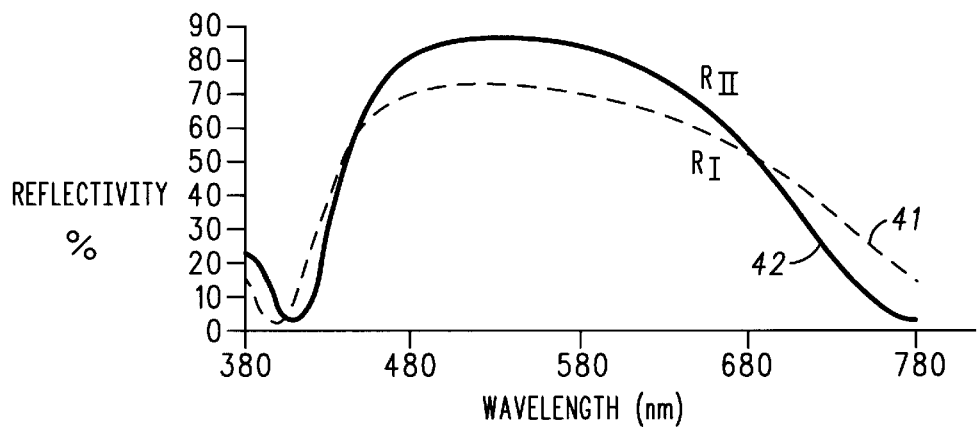
FIG. 6
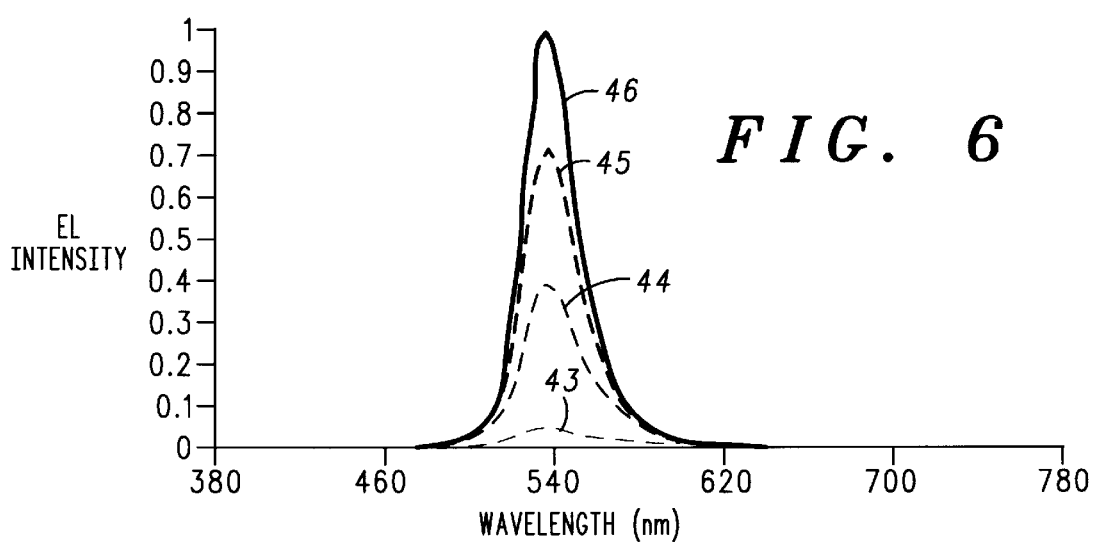

ORGANIC ELECTROLUMINESCENT DEVICE WITH PLURAL MICROCAVITIES

FIELD OF THE INVENTION

The present invention pertains to light emitting diodes and more specifically to apparatus for enhancing the power and/or color of the light output of organic light emitting diodes.

BACKGROUND OF THE INVENTION

Light emitting diode (LED) arrays are becoming more popular as an image source in both direct view and virtual image displays. One reason for this is the fact that LEDs are capable of generating relatively high amounts of light (high luminance), which means that displays incorporating LED arrays can be used in a greater variety of ambient conditions. For example, reflective liquid crystal displays (LCD's) can only be used in high ambient light conditions because they derive their light from the ambient light, i.e. the ambient light is reflected by the LCDs. Some transflective LCDs are designed to operate in a transmissive mode and incorporate a backlighting arrangement for use when ambient light is insufficient. In addition, transflective displays have a certain visual aspect and some users prefer a bright emissive display. However, these types of displays are generally too large for practical use in very small devices, such as portable electronic devices.

Organic electroluminescent device (OED) arrays are emerging as a potentially viable design choice for use in small products, especially small portable electronic devices, such as pagers, cellular and portable telephones, two-way radios, data banks, etc. OED arrays are capable of generating sufficient light for use in displays under a variety of ambient light conditions (from little or no ambient light to bright ambient light). Further, OEDs can be fabricated relatively cheaply and in a variety of sizes from very small (less than a tenth millimeter in diameter) to relatively large (greater than an inch) so that OED arrays can be fabricated in a variety of sizes. Also, OEDs have the added advantage that their emissive operation provides a very wide viewing angle.

In spite of all the advantages of OEDs there are still some drawbacks to their use. One of the drawbacks is the fact that light emitted by OEDs is dependent upon the amount of current applied to the OED. Thus, to produce sufficient light for use in displays substantial amounts of current must be applied. As a typical example, with a 64×32 array of devices forming a four line by 11 character display the following devices will use approximately the listed amount of power to produce equal light out. If the devices are semiconductor light emitting diodes the display will require approximately 1 Watt (w) of power; organic light emitting diodes will require approximately 150 mw of power; LCDs with a backlight will require approximately 120 mw of power; and reflective LCDs will require approximately 20 mw of power.

One additional problem with the use of LCDs is the contrast ratio, or the difference between light and dark pixels. LCDs have a contrast ratio of 3–6 while OEDs and LEDs have a contrast ratio in excess of 150. Thus, while OEDs and LEDs produce sufficient light for operation under any ambient light conditions, they use a comparatively large amount of power.

An additional problem in the use of OEDs in displays is the generation of the colors necessary to achieve a full color display. Red, green and blue OEDs can be fabricated but they require different organic materials and, thus, each color must be fabricated separately. To overcome this problem, OEDs with a relatively broad spectrum have been used in the prior art and a microcavity is formed on the light outlet. The microcavity can be tuned to one or more frequencies so that a specific color of light is accentuated. See for example, the following publications: "Physics and Device Applications of Optical Microcavities", by H. Yokoyama, *Science*, Vol. 256, Apr. 3, 1992, pp. 66–70; "Optical Processes in Microcavities", by Yamamoto et al., *Physics Today*, June 1993, pp. 66–73; "Microcavity Effects in Organic Semiconductors", by Dodabalapur et al., *Applied Physics Letters*, Vol. 64 (19), May 9, 1994, pp. 2486–2488; Sharply Directed Emission in Organic Electroluminescent Diodes With an Optical-Microcavity Structure", by Tsutsui et al, *Applied Physics Letters*, vol. 65 (15), Oct. 10, 1994, pp. 1868–1870; Strongly Directed Single Mode Emission From Organic Electroluminescent Diode With a Microcavity", by Tokito et al., *Applied Physics Letter*, Vol. 68 (19) May 6, 1996, pp. 2633–2635; Efficient Enhancement of Microcavity Organic Light Emitting Diodes", by Jordan et al.,*Applied Physics Letters*, Vol. 69 (14), Sep. 30, 1996, pp. 1997–1999; and "Physics and Applications of Organic Microcavity Light Emitting Diodes", by Dodabalapur et al., *Journal of Applied Physics*, Vol. 80 (12), Dec. 15, 1996, pp. 6954–6964.

Accordingly, it is highly desirable to produce an OED with enhanced light output which uses less power.

It is a purpose of the present invention to provide a new and improved light emitting device with enhanced light output.

It is another purpose of the present invention to provide a new and improved organic light emitting device with enhanced light output which uses less electrical power.

It is still another purpose of the present invention to provide a new and improved light emitting device with improved colored light output.

SUMMARY OF THE INVENTION

The above problems and others are at least partially solved and the above purposes and others are realized in a light emitting diode having a first microcavity and a second microcavity positioned in tandem with the light output to enhance the light output.

The first microcavity includes a first plurality of layers of material having different indexes of refraction such that the first plurality of layers operates as a first mirror stack. The first plurality of layers is positioned in spaced relationship from the diode light output to reflect light from the diode light output toward the organic light emitting diode and to cooperate with the organic light emitting diode to define an optical length of the first microcavity. Also, the optical length of the first microcavity is designed so that light emitted from the first microcavity has a first spectrum.

A second microcavity includes a second plurality of layers of material having different indexes of refraction such that the second plurality of layers operates as a second mirror stack. The second plurality of layers is positioned in spaced relationship from the first microcavity light output to reflect light from the first microcavity toward the first microcavity and to define an optical length of the second microcavity. The optical length of the second microcavity is designed so that light emitted from the second microcavity has a second spectrum.

While only two microcavities are described, it will be understood by those skilled in the art after reading the present disclosure that additional microcavities can be placed in tandem in the light output to further alter the light spectrum. For example, by properly designing the optical length of a first microcavity of the plurality of microcavities a peak of the light spectrum can be shifted toward 465 nm to enhance blue colored light output. Also, by properly designing the optical length of the first microcavity of the plurality of microcavities a peak of the light spectrum can be shifted toward 620 nm to enhance red colored light output. Further, by adjusting the optical length of each of the microcavities of the plurality of microcavities to coincide with a natural peak of the diode and to be substantially equal, the light output of the diode can be substantially enhanced.

BRIEF DESCRIPTION OF THE DRAWINGS

Referring to the drawings:

FIG. 3 is an enlarged and simplified sectional view of a portion of a microcavity;

FIG. 4 is an enlarged and simplified sectional view of a portion of a microcavity illustrating a further modification in accordance with the present invention;

FIG. 5 illustrates the reflectivity of the structure of FIG. 4 as a function of the wavelength of emitted light;

FIG. 6 illustrates the EL spectrum for the structure of FIG. 4;

DESCRIPTION OF THE PREFERRED EMBODIMENTS

Figure 1:
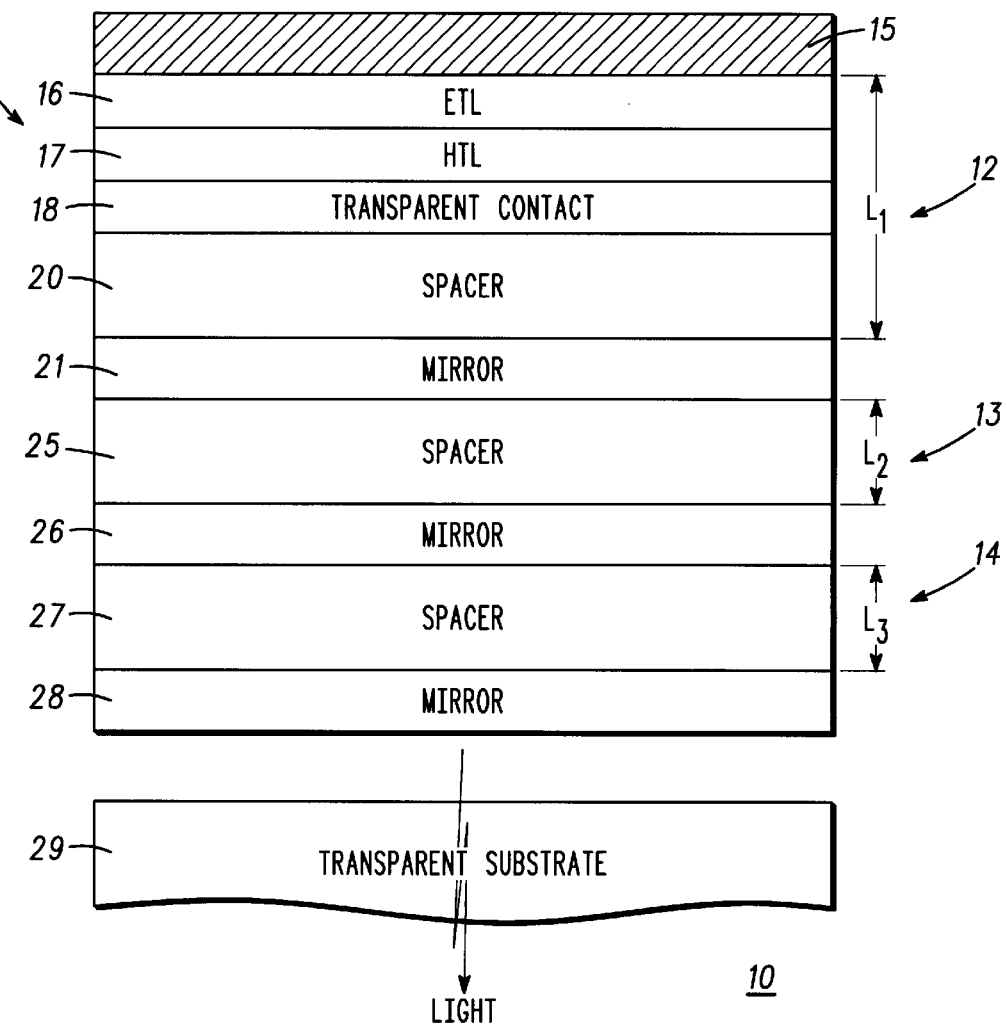
FIG. 1 is an enlarged and simplified sectional view of a multi-microcavity organic light emitting device in accordance with the present invention.

Turning now to the figures, FIG. 1 is an enlarged and simplified sectional view of a multi-microcavity light emitting device 10 in accordance with the present invention. Multi-microcavity light emitting device 10 includes a light emitting diode, generally designated 11 and a plurality of microcavities 12, 13, and 14 positioned in tandem with the light output from diode 11 to successively alter the light spectrum.

In this embodiment, light emitting diode 11 includes an organic light emitting diode with an upper metal electrical contact 15, an electron transporting layer 16, a hole transporting layer 17 and a lower electrical contact 18. Upper electrical contact 15 essentially forms a reflective surface to reflect all light generated within diode 11 downwardly. Lower electrical contact 18 is formed of some electrically conductive material which is transparent to light generated in diode 11, such as indium-tin-oxide (ITO) or the like and defines the diode light output for device 10. Electron transporting layer 16 and hole transporting layer 17 define an organic light emitting zone with either or both layers 16 and 17 emitting light in response to the recombination of holes and electrons therein. It will of course be understood that diode 11 could include from one organic layer to several, depending upon the material utilized.

Microcavity 12 is illustrated in FIG. 1 as including diode 11, a transparent spacer 20 and a mirror stack 21. Spacer 20 is formed of any convenient material which is transparent to the light emitted by diode 11, such as silicon nitride or silicon dioxide. Mirror stack 21 includes a plurality of layers of material having different indexes of refraction. The plurality of layers is divided into pairs of layers, one layer of each pair having a first index of refraction and another layer of each pair having a second index of refraction lower than the first index of refraction with each pair of layers cooperating to form a partial mirror and to reflect light. The plurality of layers can be formed from a variety of materials including various semi-transparent metals and various dielectrics. In a typical example, mirror stack 21 is formed of alternate layers of $TiO_2$ and $SiO_2$. Generally, from 2 to 4 pairs of layers provides a reflectivity of approximately 0.74, which is believed to be optimal for the present purpose. As is understood by those skilled in the art, each pair of layers of mirror stack 21 defines a partial mirror with an operating thickness of an integer multiple of one half wavelength of the emitted light so that all reflected light is in phase.

Spacer 20 is designed to position mirror stack 21 in spaced relationship from the light output of diode 11 to reflect light from the light output of diode 11 back toward diode 11 and to define an optical length $L_1$ of microcavity 12 in cooperation with the diode 11. Stack 21 further defines a light output for microcavity 12, and the optical length of microcavity 12 is generally designed such that light emitted from the light output has a desired spectrum.

Microcavity 13 is formed similar to microcavity 12 and includes a transparent spacer 25 and a mirror stack 26. Spacer 25 is formed of any convenient material which is transparent to the light emitted by diode 11, generally as described above. Mirror stack 26 includes a plurality of layers of material divided into pairs of layers, one layer of each pair having a first index of refraction and another layer of each pair having a second index of refraction lower than the first index of refraction with each pair of layers cooperating to form a partial mirror and to reflect light. Generally, from 2 to 4 pairs of layers provides a reflectivity of approximately 0.74, which is believed to be optimal for the present purpose. Spacer 25 is mounted adjacent stack 21 to receive light from microcavity 12 and positions stack 26 in spaced relationship from microcavity 12 to reflect light from the light output of microcavity 12 back toward microcavity 12 and to define an optical length $L_2$ of microcavity 13. The optical length of microcavity 13 is such that emitted light has a desired spectrum.

Additional microcavities (e.g. microcavity 14), each including a transparent spacer 27 with a mirror 28 stack, can be positioned in tandem with microcavities 12 and 13. Each additional microcavity is positioned in tandem with a previous microcavity to provide a light output with a different spectrum, as will be explained in more detail presently. The last of these microcavities 13 and 14 in tandem are positioned on a transparent substrate 29.

Figure 2:
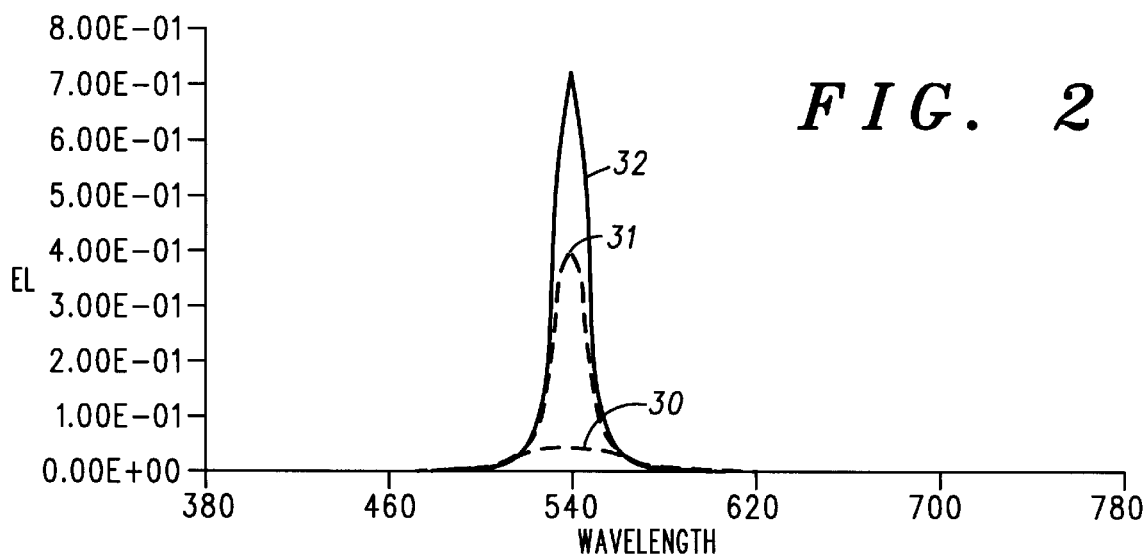
FIG. 2 illustrates the EL spectrum for the device of FIG. 1.

Turning now to FIG. 2, an EL spectrum for a specific embodiment of device 10 of FIG. 1 is illustrated. In this specific embodiment, an emissive layer of aluminum tris 8-hydroxyquinoline or 8-hydroxyquinoline aluminum (Alq) is doped with N, N-dimeghyl quinacridone (MQA) to produce light emission centered at 540 nm as represented by spectrum 30 illustrated in broken lines. A second spectrum 31 (drawn in broken line) illustrates the light output from microcavity 12 and a third spectrum 32 (drawn in solid lines) illustrates the light output from microcavity 13. As can be seen from FIG. 2, each light spectrum 30, 31, and 32 is modified from the previous spectrum, in this example by reducing the bandwidth and increasing the intensity. Generally, to achieve the result illustrated in FIG. 2 each of the microcavities are tuned to the same wavelength (e.g. 540 nm) by adjusting the length of the cavity, in this example all of the microcavities have a substantially equal optical length.

Turning now to FIGS. 3 and 4, enlarged and simplified sectional views are illustrated of a portion of a microcavity showing a further modification in accordance with the present invention. In FIG. 3, a mirror stack 35 includes five layers of material forming two complete pairs of layers and an additional layer, each pair including a layer designated A and a layer designated B and the additional layer making mirror stack 35 symmetrical. In this structure the reflectivity to light entering from the left, represented by arrow 36, is equal to the reflectivity to light entering from the right, represented by arrow 37.

Referring to FIG. 4, a mirror stack 38 includes three complete pairs of layers with each pair including a layer designated A and a layer designated B. In the structure of FIG. 4 the reflectivity to light entering from the left, represented by arrow 39, is different than the reflectivity to light entering from the right, represented by arrow 40. The difference in reflectivity depends upon the materials being used. For example, if layers A are formed of $SiO_2$ and layer B is formed of $TiO_2$ then the reflectivity of light from the left (arrow 39) is approximately 0.74 and the reflectivity of light from the right (arrow 40) is approximately 0.88. The reflectivity as a function of the wavelength of emitted light is illustrated in FIG. 5, with curve 41 representing the reflectivity to light from the left in FIG. 4 and curve 42 representing the reflectivity to light from the right in FIG. 4.

It has been found that the use of a mirror stack similar to that illustrated in FIG. 4 in the microcavity of device 10 in FIG. 1 provides an additional and substantial improvement in the emitted light intensity. This improvement is achieved by retaining light, which has moved form first cavity 12 into second cavity 13, in second cavity 13 and not allowing the light to return to first cavity 12. By making the reflectivity of first cavity 12 greater at the lower end (junction of first cavity 12 and second cavity 13), most of the light which reaches second cavity 13 is prevented from returning to first cavity 12. A difference of at least 0.1 in the reflectivity is preferred with a greater difference resulting in less returning light. In addition to the method of increasing the reflectivity described in conjunction with FIG. 4, a final layer of material with a different reflectivity can be added or substituted for the final B layer, or a high reflectivity coating can be applied to the final layer (B or A). Referring to FIG. 6, a curve 43 represents the spectrum for light emitted by diode 11, curve 44 represents the spectrum for light emitted by microcavity 12, curve 45 represents the spectrum for light emitted by microcavity 13, and curve 46 represents the light emitted by microcavity 13 when microcavity 12 is constructed as illustrated in FIG. 4.

Figure 7:
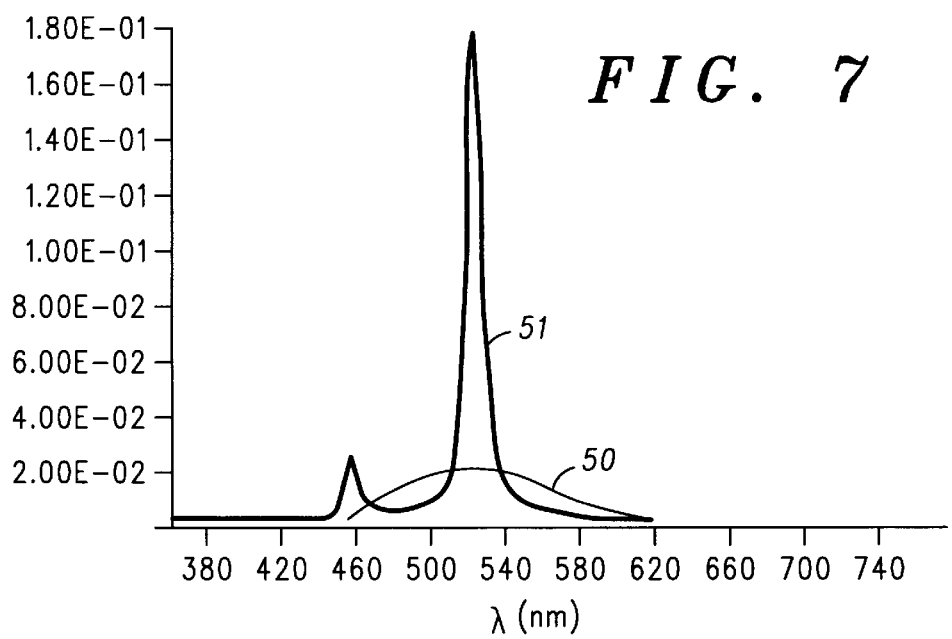
FIG. 7 illustrates the light output as a function of the wavelength of emitted light in a single microcavity device.

Turning now to FIG. 7, a first curve 50 representing the light output of an organic light emitting diode is illustrated as a function of the wavelength of the emitted light. As illustrated in FIGS. 2 and 5, if a single microcavity is placed in tandem with the diode and tuned to the peak of the diode output (540 nm) the light output spectrum is narrowed and increased in height. However, the microcavity can be tuned to simultaneously enhance two different frequencies (or modes), as shown by a second curve 51 in FIG. 7. To achieve this two mode enhancement the microcavity length must be adjusted to simultaneously enhance both modes. In this specific example the modes are at 465 nm and 530 nm and the length $L_1$ of the microcavity is approximately 1855 nm.

Figure 8:
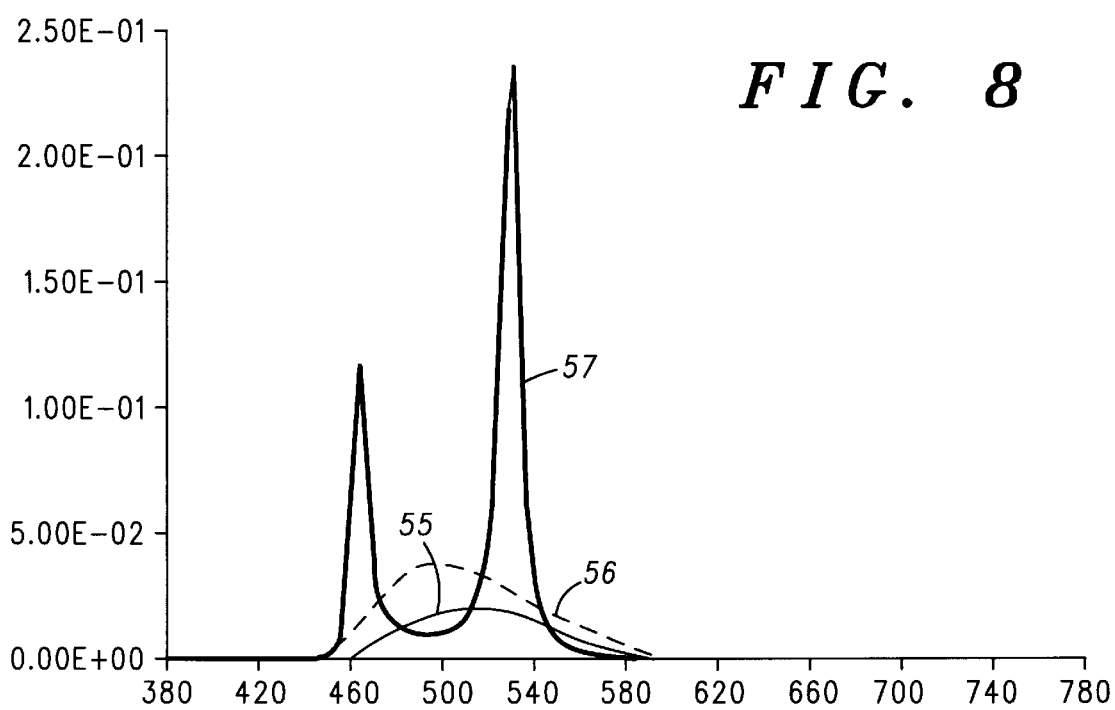
FIG. 8 illustrates the light output as a function of the wavelength of emitted light in a multi-microcavity device in accordance with the present invention.

However, it can be seen by referring to FIG. 7 that the peak at 465 nm is very much smaller than the peak at 530 nm and it is impossible to change the blue/green ratio with this device. Turning to FIG. 8, a solution to this problem is illustrated. The curves of FIG. 8 represent the EL spectra for a multi-microcavity device in accordance with the present invention. A first curve 55 represents the output light spectrum for a diode, such as diode 11 in FIG. 1. A second curve 56 represents the output light spectrum (for example) of microcavity 12 in FIG. 1, with microcavity 12 tuned to shift the peak of the light spectrum toward the blue side of the spectrum, rather than tuning it to the peak of the light emitted by diode 11.

The second microcavity 13 is then tuned to simultaneously enhance two different frequencies (or modes), as shown by a third curve 57 in FIG. 8. To achieve this two mode enhancement the microcavity length must be adjusted to simultaneously enhance both modes. In this specific example the modes are at 465 nm (blue light) and 530 nm (green light). Because the light at 465 nm has been substantially enhanced by microcavity 12, when microcavity 13 is tuned to the two different modes or frequencies the final output is substantially enhanced as illustrated in FIG. 8. An additional microcavity (microcavity 14 in FIG. 1) could then be tuned to either peak to provide a desired color and to further enhance the intensity.

It should be noted that microcavity 12 could be tuned to shift the peak of the light spectrum toward the red side of the spectrum, rather than tuning it to the peak of the light emitted by diode 11. By shifting the spectrum up instead of down, the two peaks enhanced by microcavity 13 could be at 530 nm (green light) and 620 nm (red light), if desired. Many other shifts and modifications are possible by using a plurality of microcavities. By enhancing one or more peaks, the power used in driving the diode can be reduced until the output is commensurate with the needs of a specific application. In this fashion, an organic light emitting diode (electroluminescent device) with multi-microcavities in tandem will use less than 20 mw in the example first described above.

Thus, an OED with enhanced light output which uses less power has been disclosed. The new and improved light emitting device with enhanced light output uses less electrical power than similar devices and approximately the same amount of power as a reflective LCD while providing the substantial viewing advantages of an OED. Further, the new and improved light emitting device can be tuned to improved colored light output.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An organic light emitting device comprising a first microcavity including an organic light emitting diode and a first mirror, having a light output with a light spectrum and one or more additional microcavities, each additional microcavity including a mirror positioned in tandem with the light output to successively alter the light spectrum.

2. An organic light emitting device as claimed in claim 1 wherein the optical length of the first microcavity is constructed to shift a peak of the light spectrum toward a blue side of the light spectrum.

3. An organic light emitting device as claimed in claim 1 wherein the optical length of the first microcavity is constructed to shift a peak of the light spectrum toward a red side of the light spectrum.

4. An organic light emitting device as claimed in claim 1 wherein each of the first and additional microcavities has a substantially equal optical length.

5. An organic light emitting device comprising:
- an organic light emitting diode including a diode light output;
- a first microcavity including a first plurality of layers of material having different indexes of refraction such that the first plurality of layers operates as a first mirror stack, the first plurality of layers being positioned in spaced relationship from the diode light output to reflect light from the diode light output toward the organic light emitting diode and to cooperate with the organic light emitting diode to define an optical length of the first microcavity, the first plurality of layers further defining a first microcavity light output, and the optical length of the first microcavity being such that light emitted from the first microcavity light output has a first spectrum; and
- a second microcavity including a second plurality of layers of material having different indexes of refraction such that the second plurality of layers operates as a second mirror stack, the second plurality of layers being positioned in spaced relationship from the first microcavity light output to reflect light from the first microcavity light output toward the first microcavity and to define an optical length of the second microcavity, the second plurality of layers further defining a second microcavity light output, and the optical length of the second microcavity being such that light emitted from the second microcavity light output has a second spectrum.

6. An organic light emitting device as claimed in claim 5 wherein the organic light emitting diode includes an organic light emitting zone sandwiched between first and second electrical contacts with the first electrical contact being transparent to emitted light and defining the diode light output.

7. An organic light emitting device as claimed in claim 6 wherein the second electrical contact of the organic light emitting diode includes metal, the metal forming a reflective surface in the organic light emitting diode opposite the diode light output.

8. An organic light emitting device as claimed in claim 5 wherein the first and second pluralities of layers of material each include pairs of layers, one layer of each pair having a first index of refraction and another layer of each pair having a second index of refraction lower than the first index of refraction with each pair of layers cooperating to reflect light.

9. An organic light emitting device as claimed in claim 8 wherein each pair of layers of the first and second pluralities of layers defines a partial mirror with an operating thickness of an integer multiple of one half wavelength of the emitted light.

10. An organic light emitting device as claimed in claim 8 wherein each pair of layers includes a layer of silicon dioxide and a layer of titanium dioxide.

11. An organic light emitting device as claimed in claim 5 wherein the first plurality of layers of material is constructed with a first reflectivity to light from the first transparent spacer and a second reflectivity to light from the second transparent spacer, the first reflectivity being lower than the second reflectivity.

12. An organic light emitting device as claimed in claim 11 wherein the first plurality of layers of material includes a final layer adjacent the second transparent spacer formed to increase the second reflectivity above the first reflectivity.

13. An organic light emitting device as claimed in claim 11 wherein the second reflectivity is at least 0.1 greater than the first reflectivity.

14. An organic light emitting device as claimed in claim 5 wherein the optical length of the first microcavity is constructed to shift a peak of the first spectrum toward a blue side of the light spectrum.

15. An organic light emitting device as claimed in claim 5 wherein the optical length of the first microcavity is constructed to shift a peak of the first spectrum toward a red side of the light spectrum.

16. An organic light emitting device as claimed in claim 5 including additional microcavities each including a transparent spacer with a plurality of layers of material having different indexes of refraction positioned thereon so as to operate as a mirror stack, each additional microcavity being positioned in tandem with a previous microcavity to provide a light output with a different spectrum.

17. An organic light emitting device as claimed in claim 16 wherein the first and second microcavities and each additional microcavity all have a substantially equal optical length.

18. An organic light emitting device comprising:
- an organic light emitting diode including an organic light emitting zone sandwiched between first and second electrical contacts with the first electrical contact being transparent to emitted light and defining the diode light output;
- a first microcavity including a first transparent spacer positioned adjacent the diode light output and a first plurality of layers of dielectric material having different indexes of refraction such that the first plurality of layers operates as a first mirror stack, the first plurality of layers being positioned on the first transparent spacer so as to reflect light toward the organic light emitting diode and to cooperate with the first transparent spacer and the organic light emitting diode to define an optical length of the first microcavity, the first plurality of layers further defining a first microcavity light output, the optical length of the first microcavity being such that light emitted from the first microcavity light output has a first spectrum;
- a second microcavity including a second transparent spacer positioned adjacent the first microcavity light output and a second plurality of layers of dielectric material having different indexes of refraction such that the second plurality of layers operates as a second mirror stack, the second plurality of layers being positioned on the second spacer so as to reflect light toward the first microcavity and to define an optical length of the second microcavity, the second plurality of layers further defining a second microcavity light output, the optical length of the second microcavity being such that light emitted from the second microcavity light output has a second spectrum; and
- a transparent substrate supporting the second microcavity and defining a device light output.

19. An organic light emitting device as claimed in claim 18 wherein the first and second pluralities of layers of material each include pairs of layers, one layer of each pair having a first index of refraction and another layer of each pair having a second index of refraction lower than the first index of refraction with each pair of layers cooperating to reflect light.

20. An organic light emitting device as claimed in claim 19 wherein each pair of layers defines a partial mirror with an operating thickness of an integer multiple of one half wavelength of the emitted light.

21. An organic light emitting device as claimed in claim 19 wherein each pair of layers includes a layer of silicon dioxide and a layer of titanium dioxide.

22. An organic light emitting device as claimed in claim 18 wherein the first plurality of layers of material is constructed with a first reflectivity to light from the first transparent spacer and a second reflectivity to light from the second transparent spacer, the first reflectivity being lower than the second reflectivity.

23. An organic light emitting device as claimed in claim 22 wherein the first plurality of layers of material includes a final layer adjacent the second transparent spacer formed to increase the second reflectivity above the first reflectivity.

24. An organic light emitting device as claimed in claim 22 wherein the second reflectivity is at least 0.1 greater than the first reflectivity.

25. An organic light emitting device as claimed in claim 18 wherein the optical length of the first microcavity is constructed to shift a peak of the first spectrum toward a blue side of the light spectrum.

26. An organic light emitting device as claimed in claim 18 wherein the optical length of the first microcavity is constructed to shift a peak of the first spectrum toward a red side of the light spectrum.

27. An organic light emitting device as claimed in claim 18 including additional microcavities each including a transparent spacer with a plurality of layers of material having different indexes of refraction positioned thereon so as to operate as a mirror stack, each additional microcavity being positioned in tandem with a previous microcavity to provide a light output with a different spectrum.

28. An light emitting device comprising:

a light emitting diode including a diode light output;

a first microcavity including a first transparent spacer positioned adjacent the diode light output and a first plurality of pairs of layers of material having different indexes of refraction such that each pair of layers of the first plurality of pairs of layers operates as a partial mirror, the first plurality of pairs of layers being positioned on the first transparent spacer so as to reflect light toward the light emitting diode and to cooperate with the first transparent spacer and the light emitting diode to define an optical length of the first microcavity, the first plurality of pairs of layers further defining a first microcavity light output, the optical length of the first microcavity being such that light emitted from the first microcavity light output has a first spectrum; and a second microcavity including a second transparent spacer positioned adjacent the first microcavity light output and a second plurality of pairs of layers of material having different indexes of refraction such that each pair of layers of the second plurality of pairs of layers operates as a partial mirror, the second plurality of pairs of layers being positioned on the second spacer so as to reflect light toward the first microcavity and to define an optical length of the second microcavity, the second plurality of pairs of layers further defining a second microcavity light output, the optical length of the second microcavity being such that light emitted from the second microcavity light output has a second spectrum.

29. An light emitting device as claimed in claim 28 wherein the first and second transparent spacers and the first and second pluralities of pairs of layers are formed of dielectric material.

30. An light emitting device as claimed in claim 28 wherein the first and second transparent spacers are formed of one of silicon nitride and silicon dioxide.

* * * * *